(12) United States Patent
Krause et al.

(10) Patent No.: US 7,791,302 B2
(45) Date of Patent: Sep. 7, 2010

(54) METHOD FOR MEASURING A MOTOR CURRENT

(75) Inventors: Uwe Krause, Pattensen (DE); Heinz Ludwig, Garbsen (DE); Uwe Nolte, Barsinghausen (DE); Guido Sonntag, Gehrden (DE)

(73) Assignee: Siemens Aktiengesellschaft, Munich (DE)

( * ) Notice: Subject to any disclaimer, the term of this patent is extended or adjusted under 35 U.S.C. 154(b) by 329 days.

(21) Appl. No.: 12/083,756

(22) PCT Filed: Oct. 17, 2006

(86) PCT No.: PCT/EP2006/067484

§ 371 (c)(1),
(2), (4) Date: Apr. 18, 2008

(87) PCT Pub. No.: WO2007/045645

PCT Pub. Date: Apr. 26, 2007

(65) Prior Publication Data

US 2009/0009121 A1    Jan. 8, 2009

(30) Foreign Application Priority Data

Oct. 18, 2005  (DE) .................. 10 2005 050 130
Oct. 9, 2006   (DE) .................. 10 2006 047 707

(51) Int. Cl.
*H02P 7/06* (2006.01)

(52) U.S. Cl. .................. 318/503; 318/254; 318/400.11; 318/400.38; 318/599; 388/811

(58) Field of Classification Search ............. 318/503, 318/254, 599, 400.11, 400.38; 388/811
See application file for complete search history.

(56) References Cited

U.S. PATENT DOCUMENTS

| 4,866,356 | A  | * | 9/1989  | Altendorf .................. 388/811 |
| 5,689,162 | A  | * | 11/1997 | Li .......................... 318/599 |
| 5,930,103 | A  |   | 7/1999  | Heck |
| 6,424,799 | B1 | * | 7/2002  | Gilmore ................... 388/811 |
| 6,680,593 | B2 | * | 1/2004  | Gotou .................. 318/400.04 |
| 6,836,614 | B2 | * | 12/2004 | Gilmore ................... 388/811 |
| 7,112,934 | B2 | * | 9/2006  | Gilmore ................... 318/432 |
| 7,268,502 | B2 | * | 9/2007  | Dornhof ............... 318/400.38 |
| 2002/0121871 | A1 | * | 9/2002  | Gotou ...................... 318/254 |
| 2002/0153856 | A1 | * | 10/2002 | Gilmore ................... 318/599 |
| 2004/0217727 | A1 | * | 11/2004 | Gilmore ................... 318/599 |
| 2006/0119300 | A1 | * | 6/2006  | Armstrong ............... 318/254 |
| 2006/0125431 | A1 | * | 6/2006  | Dornhof ................... 318/85 |
| 2009/0251084 | A1 | * | 10/2009 | Haas et al. ............ 318/400.11 |

* cited by examiner

Primary Examiner—Paul Ip

(57) ABSTRACT

The invention relates to a method for measuring a current that flows through a motor, in which a power switch that supplies the motor with electric energy is controlled by a control unit via a pulse width-modulation signal. The pulse width-modulation signal comprises a cycle of operation and the motor current is determined in a feeder to the power switch or a feeder to the motor. Since exactly one measured value representing the motor current is sampled in each cycle of operation, this permits the provision of a method for measuring the motor current, which determines the motor current in a more rapid, more cost-effective manner than in prior art. The method is used for the motor control of direct current motors.

5 Claims, 1 Drawing Sheet

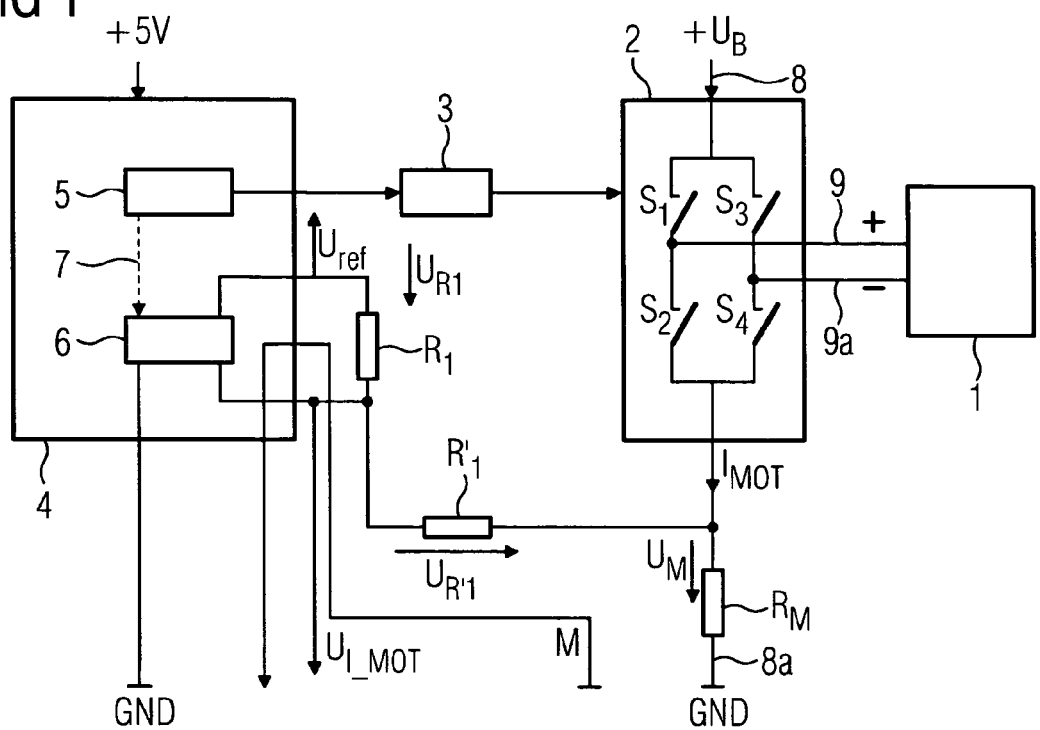
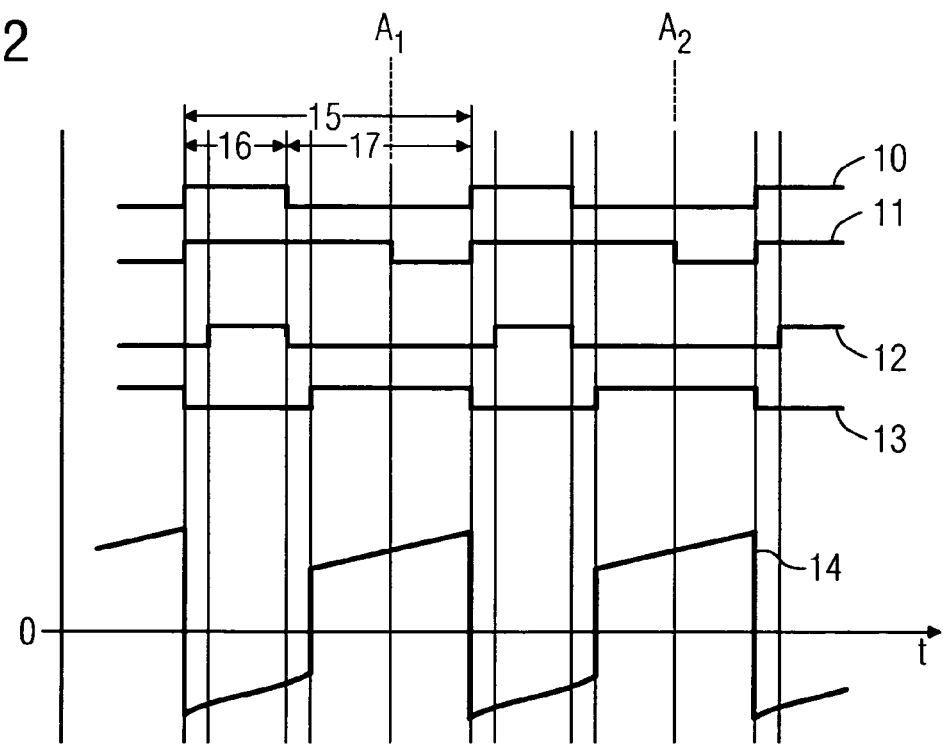

METHOD FOR MEASURING A MOTOR CURRENT

CROSS REFERENCE TO RELATED APPLICATIONS

This application is the US National Stage of International Application No. PCT/EP2006/067484, filed Oct. 17, 2006 and claims the benefit thereof. The International Application claims the benefits of German application No. 10 2005 047 707.3 filed Oct. 9, 2006 and German application No. 10 2005 050 130.3 filed Oct. 18, 2005. All of the applications are incorporated by reference herein in their entirety.

FIELD OF INVENTION

The invention relates to a method for measuring a current flowing through a motor, wherein a power switching section, which supplies the motor with electrical power, is controlled by means of a control unit via a pulse-width modulation signal, the pulse-width modulation signal has a switching cycle, and the motor current is determined.

BACKGROUND OF THE INVENTION

A preferably signed measurement of the motor current for a clocked application, that is to say for example an application in which the motor is operated on an H-bridge, requires a high level of circuit complexity, since both motor connections are clocked continuously, that is to say they are supplied with pulsed power, and the potential is therefore shifted with respect to evaluation electronics.

An H-bridge is in general an electronic circuit comprising four switches, and is preferably formed using transistors and/or power semiconductors. The H-bridge converts a DC voltage to an AC voltage at a variable frequency and with a variable pulse width. A circuit such as this is used in particular for driving direct-current motors and for selection of the rotation direction. However, an H-bridge can also be used to feed a transformer from DC voltage power supply systems. Furthermore, an H-bridge is used, for example, in modern switched-mode power supplies.

The clocking process results in the motor current having an alternating component whose magnitude depends on the terminal voltage, the duty ratio, or the pulse to pause ratio, of a pulse-width modulation signal and the effective inductance of the motor. The measurement of any given instantaneous value of the motor current is therefore always subject to some uncertainty relating to the alternating component. According to the prior art, in order to avoid a measurement error, for example caused by so-called current ripple, a plurality of measured values are recorded and are determined by means of an averaging process, for example by means of a low-pass filter with a cut-off frequency which corresponds to a fraction of the clock frequency. The measured value determined in this way is then available only with a corresponding time delay.

SUMMARY OF INVENTION

The object of the invention is to specify a method for measuring a motor current which determines the motor current at less cost and more quickly than is the case in the prior art.

This object is achieved by the method mentioned initially in that one and only one measured value which represents the motor current is sampled in each switching cycle. The event-controlled selection of a measured value means that there is no need for averaging, thus resulting in an enormous gain in speed for measurement.

In one advantageous development of the invention, the measured value is sampled in a supply line to the power switching section or in a supply line to the motor. There is no longer any need to take into account a potential shift between the evaluation electronics and the supply lines, which have a disadvantageous effect on the measurement result.

According to a further refinement, a variable which is proportional to the motor current is sampled as a representative measured value. Since the motor current can also be represented by various variables which are proportional to the motor current, it is advantageous not to measure the motor current directly, but to determine it by means of an indirect method. In comparison to a direct motor current measurement, particularly when the currents are very high, the determination of a proportional variable allows the circuit design and the metrology complexity to be kept low.

In one advantageous refinement, the variable which is proportional to the motor current is formed by means of the voltage drop across a current measurement resistor. The introduction, for example, of a low-value measurement resistor into a supply line for the power switching section provides a simple and low-cost measurement method by measuring the voltage across a so-called shunt.

In this case, it is expedient that the voltage drop within a voltage mesh influences an input voltage of an A/D converter such that the motor current is determined by any discrepancy from a reference voltage. This indirect current measurement by means of the shunt allows the current to be measured with little power being consumed.

In one preferred embodiment, a time for sampling is defined by a trigger signal from the control unit. The trigger signal results in sampling synchronization by means of the A/D converter, thus making it possible to avoid the time for averaging. The additional trigger signal which is determined from the pulse-width modulation signal from a pulse-width modulator allows the sampling time to be defined reliably and reproducibly. The control unit allows the sampling time to be chosen freely on an application-specific basis.

In order to ensure that the sampling time corresponds as accurately as possible to the time at which the sampled value corresponds to the mean value of the motor current with a minimum discrepancy, it is advantageous for the trigger signal to be variable such that the time can be shifted in order to compensate for delay time errors.

Since a switching cycle has a pulse section with a pulse width and a pause section with a pause width, it is advantageous for the sampling time to be placed in the center of the time of one of the two cycle sections. This takes account of the fact that the current ripple is always symmetrical with respect to the mean value of the current and, to a first approximation, has a linear profile. The continuously rising current preferably intersects the mean value precisely in the center of a current-flow cycle. If the instantaneous value of the current is therefore recorded at the center of a current-flow cycle, then this value corresponds to the mean value of the current to be recorded, and there is additionally no need to take into account transient times in the measurement.

A further improvement in the measurement accuracy is achieved by placing the sampling time in the center of the time of the longer cycle section. The time at the center of the respectively longer current-flow phase is preferably used for sampling purposes, in order to improve the measurement accuracy. When sampling in the longer current-flow phase, switching current surges resulting from a relatively low current rate of rise and any possible time error in the triggering or sampling have less effect.

In a further refinement, the drive direction of the power switching section is taken into account in order to determine the current direction of the motor current. By additionally taking account of the drive direction of the H-bridge, the motor current value determined according to the invention can accordingly be multiplied by +1 or −1, and matches the magnitude and sign of the actual current value of the motor.

BRIEF DESCRIPTION OF THE DRAWINGS

One exemplary embodiment of the invention will be explained in more detail in the following text with reference to the drawing, in which:

FIG. 1 shows a schematic illustration of a motor drive with a measurement device, FIG. 2 shows an overview of the time profiles of drive signals and of a voltage across a measurement resistor.

DETAILED DESCRIPTION OF INVENTION

FIG. 1 shows a block diagram of a motor drive for a motor 1. The motor 1 is in the form of a direct-current motor. The motor 1 is supplied with electrical power via the motor supply lines 9, 9a and via a power switching section 2. The power switching section 2 is in the form of an H-bridge. A control unit 4 produces a plurality of drive signals for the power switching section 2, via a driver 3. The control unit 4 has a pulse-width modulator 5 and an analog/digital converter 6, the A/D converter 6 for short, which are formed by a freely configurable microcontroller. The control unit 4 is supplied with the required supply voltage at a +5 V connection and a ground connection GND. In addition to the major elements comprising the pulse-width modulator 5 and the A/D converter 6, further functions can also be implemented in the microcontroller, for example recording of surge currents or an operating time counter.

In addition to supplying the power switching section 2 with the drive signals for the H-bridge, the pulse-width modulator 5 is additionally designed to produce a trigger signal for the A/D converter 6. The trigger signal is passed to the A/D converter 6 via a trigger line 7. The trigger signal defines the time of sampling and measurement.

In order to measure an input voltage $U_{I\_MOT}$, the A/D converter 6 has three inputs. The A/D converter 6 is essentially supplied with a reference voltage $U_{ref}$ via a first input. The input voltage $U_{I\_MOT}$ is recorded by a further input. A third input connects the A/D converter 6 to the ground connection GND.

Since, in this exemplary embodiment, the motor current $I_{MOT}$ is not measured directly, a current measurement resistor $R_M$ is arranged in the supply line 8a to the power switching section 2. The power switching section 2 is supplied with an operating voltage $U_B$ via a further supply line 8 to the power switching section 2. A voltage divider with voltage divider resistors $R_1$ and $R_1'$ is arranged in parallel with the current measurement resistor $R_M$. The voltage $U_M$ which is dropped across the current measurement resistor $R_M$ may therefore be "tapped off". The voltage divider resistor $R_1$ is in this case connected in parallel with the inputs for the reference voltage $U_{ref}$ and for the input voltage $U_{I\_MOT}$ for the A/D converter 6.

The DC voltage supply for the power switching section 2, that is to say the H-bridge, is provided via the supply lines 8, 8a to the power switching section 2. The supply line 8 supplies the power switching section 2 with the positive operating voltage $U_B$. The power switching section 2 is connected to the reference-ground potential GND via the supply line 8a to the power switching section 2. The motor 1 to be driven is located, in terms of circuitry, in a center branch between a left-hand and a right-hand bridge arm of the H-bridge. A first switch S1 is arranged in the left-hand bridge arm, and a second switch S2 is arranged connected in series. A third switch S3 is arranged in the right-hand bridge arm, and a fourth switch S4 is likewise arranged in series. The two bridge arms form a parallel circuit. The four switches S1 to S4 are preferably metal-oxide semiconductor field-effect transistors. Field-effect transistors such as these have control inputs. The relevant field-effect transistors can be switched on and off via these control inputs by means of the appropriate drive signals from the control unit 4.

The respectively diagonally opposite switches, for example S2 and S3, are closed by the control unit 4. While the switches S2 and S3 are closed, the switches S1 and S4 remain open since, otherwise, this would result in the supply voltage $U_B$ being directly shorted. The current $I_{MOT}$, in this switch position, flows via the supply line 8 to the power switching section 2 via the switch S3, via the supply line 9a to the motor 1, through the motor 1, via the supply line 9 from the motor 1, via the switch S2, via the current measurement resistor $R_M$ to ground GND. This results in a specific rotation direction, as well as a torque from the motor 1. If the switches S2 and S3 are opened and the switches S1 and S4 then closed, the current $I_{MOT}$ flows through the motor 1 in the opposite direction. The motor is therefore driven in the opposite direction. The power of the motor 1 can be regulated and its rotation speed can be controlled by variation of the pulse width of the pulse-width modulation signal.

The already-mentioned resistors, current measurement resistor $R_M$, voltage divider resistors $R_1$, $R_1'$ and the inputs of the A/D converter 6 form a voltage mesh M:

$$-U_{ref}+U_{R1}+U_{R1}'+U_M=0.$$

A distinction is drawn between two situations in the following text:

In the first situation, no current flows via the H-bridge or the motor 1. The voltage divider resistors $R_1$ and $R_1'$ each have values of 10 kΩ. The current measurement resistor $R_M$ has a resistance of 1Ω. A voltage $U_{R1}'$ is in consequence dropped across the voltage divider resistor $R_1'$. If the reference voltage is $U_{ref}$=5 V, then the voltage dropped across the voltage divider resistor $R_1'$ is $U_{R1}'$=2.5 V. The voltage $U_{R1}'$ corresponds to the input voltage $U_{I\_MOT}$ to the A/D converter 6. The A/D converter 6 is provided within the microcontroller of the control unit 4 such that a measured input voltage of $U_{I\_MOT}=U_{ref}/2$ corresponds to a current $I_{MOT}$ of 0 A.

In a second situation, a current $I_{MOT}$ flows via the H-bridge and via the motor 1. The rising motor current $I_{MOT}$ causes a voltage drop $U_M$ across the current measurement resistor $R_M$. This voltage drop $U_M$ across the current measurement resistor $R_M$ changes the voltage drop across the voltage divider resistor $R_1$. In consequence, the voltage drop $U_{I\_MOT}$ at the measurement input of the A/D converter 6 also changes. If the current to the motor 1 increases, the voltage $U_{I\_MOT}$ at the A/D converter 6 rises proportionally. If the current to the motor 1 falls, the voltage $U_{I\_MOT}$ at the A/D converter 6 falls in a corresponding manner. In addition, the value determined in this way can be converted by multiplication by +1 or −1, depending on the respective drive direction via the H-bridge and the sampling of the analog value in the center of a current-flow cycle, directly to the signed mean value of the motor current $I_{MOT}$. The discrepancy between $U_{I\_MOT}$ and $U_{ref}/2$ is proportional to the voltage $U_M$ across the current measurement resistor $R_M$, and the current value. $I_{MOT}$ is correspondingly proportional to the voltage $U_M$, and can therefore be determined.

FIG. 2 shows the characteristic profiles of the drive signals that have been produced by means of the pulse-width modulator 5 shown in FIG. 1. A pulse-width modulation signal 10, or PWM signal 10 for short, for driving the H-bridge has a switching cycle 15 with a pulse width 16 and a pause width 17. A trigger signal 11 is derived from the PWM signal 10 from the pulse-width modulator 5 in order to define a sampling time $A_1$, $A_2$. The trigger signal 11 has a falling flank at the point $A_1$ which triggers the A/D converter 6 to sample the input voltage $U_{L\_MOT}$. This trigger signal 11 is passed via the trigger line 7 to the A/D converter 6 in FIG. 1. Furthermore, the figure shows a drive signal 12 for the switches S2 and S3, and a further drive signal 13 for the switches S1 and S4. The drive signals 12 and 13 each overlap in time at the start and end of the pulse width 16 and of the pause width 17 with an application-specific dead time. This dead time is used to avoid the switches S1 to S4 being closed at the same time. With a voltage intermediate circuit, the dead time, as illustrated, is "positive" while a "negative" dead time is used for a current intermediate circuit, that is to say a deliberate overlap is produced, during which both signals are at a positive drive potential.

If one considers the profile of the motor current $I_{MOT}$, which results from the voltage profile 14 across the current measurement resistor $R_M$ during a pause width 17, then the motor current value $I_{MOT}$ or the input voltage $U_{L\_MOT}$ to the A/D converter 6 is sampled in the center A1 of the time of the pause width 17. The continuous rise of the motor current $I_{MOT}$ and the voltage profile 14 during a pause width 17 corresponds to a linear rise, which is symmetrical with respect to the center of the time of the pause width 17. The instantaneous value determined in this way corresponds, to a good approximation, to the mean value of the motor current $I_{MOT}$.

The invention claimed is:

1. A method for measuring a current (IMOT) flowing through a motor, wherein a power switching section, which supplies the motor with electrical power, is controlled by a control unit via a pulse-width modulation signal, which has a switching cycle having a pulse section with a pulse width, and has a pause section with a pause width, wherein, in order to determine the motor current, one and only one measured value which represents the motor current is sampled in each switching cycle, whose sampling time is defined by a trigger signal from the control unit, comprising:
    varying the trigger signal for the control unit freely on a user-specific basis such that the sampling time is placed in a center of a time of the longer of the two cycle sections to compensate for delay time errors;
    determining the current direction of the motor current by taking into account the drive direction of the power switching section, wherein the determined motor current value is converted directly, by multiplication by +1 or −1, depending on the respective drive direction of the power switching section, and the sampling of the analog value in the center of a current-flow cycle, to the signed mean value of the motor current.

2. The method as claimed in claim 1, wherein the measured value which represents the motor current is sampled in a supply line to the power switching section or in a supply line to the motor.

3. The method as claimed in claim 2, wherein a variable proportional to the motor current is sampled as a representative measured value.

4. The method as claimed in claim 3, wherein the variable proportional to the motor current is formed by a voltage drop across a current measurement resistor.

5. The method as claimed in claim 4, wherein the voltage drop within a voltage mesh influences an input voltage of an A/D converter such that the motor current is determined by any discrepancy from a reference voltage.

\* \* \* \* \*